United States Patent [19]

Levin

[11] Patent Number: 4,567,094

[45] Date of Patent: Jan. 28, 1986

[54] HIGH CONDUCTIVITY GRAPHITE MATERIAL AND METHOD OF WEAVING

[75] Inventor: Jordan Levin, Winona, Minn.

[73] Assignee: Fiberite Corporation, Winona, Minn.

[21] Appl. No.: 590,640

[22] Filed: Mar. 19, 1984

Related U.S. Application Data

[62] Division of Ser. No. 217,707, Dec. 18, 1980.

[51] Int. Cl.⁴ .................. D03D 15/00; D03D 15/02
[52] U.S. Cl. .................. 428/256; 139/420 R; 139/425 R; 139/426 TW; 428/922
[58] Field of Search .................. 428/256, 922; 139/420 R, 425 R, 426 TW

[56] References Cited

U.S. PATENT DOCUMENTS

| | | | |
|---|---|---|---|
| 2,574,200 | 11/1951 | Teague | 28/74 |
| 3,039,172 | 6/1962 | Egan | 428/258 |
| 3,288,175 | 11/1966 | Valko | 428/373 |
| 3,711,934 | 1/1973 | Zorowski et al. | 29/445 |
| 3,908,040 | 9/1975 | Dauksys | 427/58 |

OTHER PUBLICATIONS

"Characteristics of Graphite Fiber/Polyimide Resin Composites", R. A. Pike and C. P. Maynard.
"Graphite-Epoxy Composite Material Properties", James E. Bell.
"Advances in Fiber Reinforced Carbon and Graphite", Allen P. Penton and W. N. Fassell.

Primary Examiner—Marion C. McCamish
Attorney, Agent, or Firm—Merchant, Gould, Smith, Edell, Welter & Schmidt

[57] ABSTRACT

A method of forming an electrically conductive weavable multifilament graphite element which comprises wrapping around a multifilament graphite element at least one electrically conductive filament.

12 Claims, 1 Drawing Figure

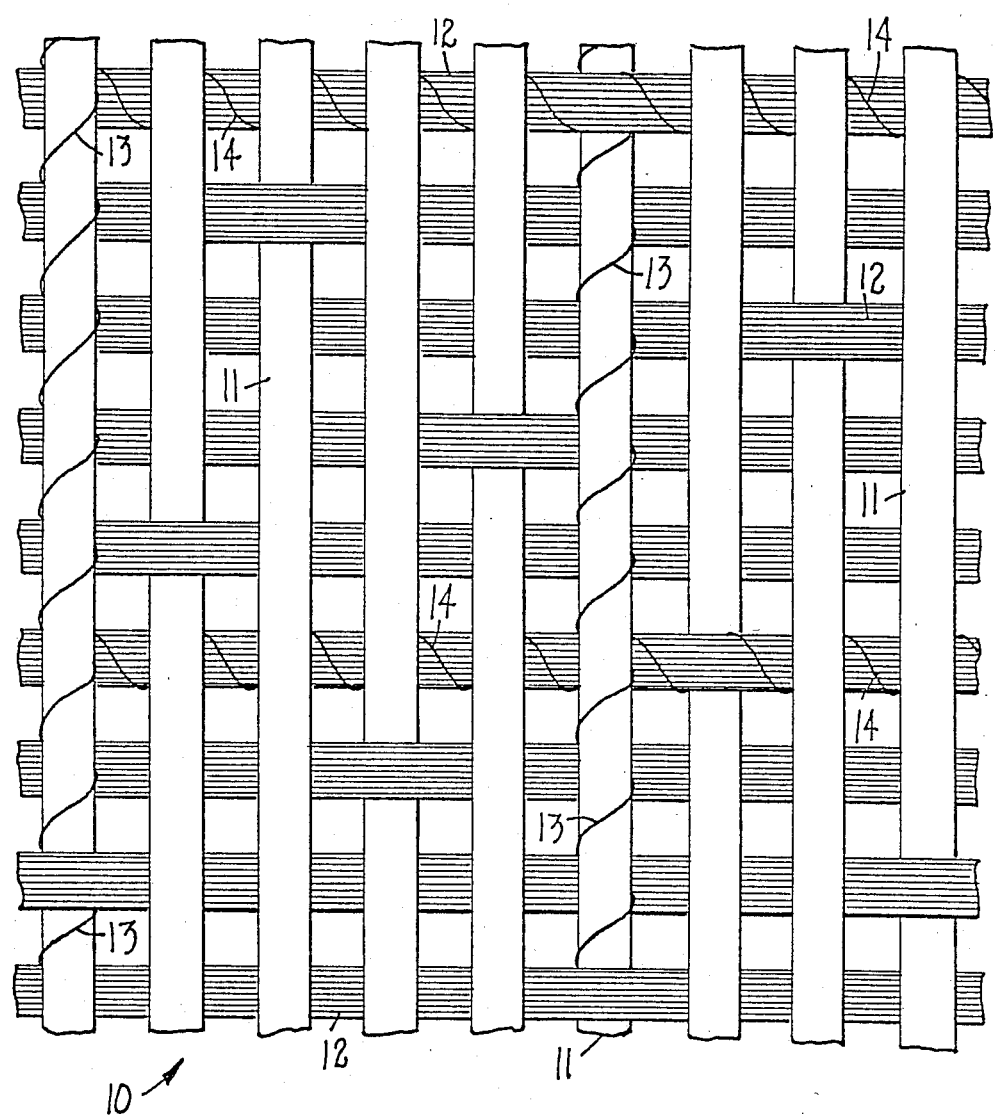

HIGH CONDUCTIVITY GRAPHITE MATERIAL AND METHOD OF WEAVING

This is a division of application Ser. No. 06/217,707, filed Dec. 18, 1980.

The present invention relates to the manufacture of fibrous graphite materials such as "pregregs" (sheet-like fibrous composites pre-impregnated with organic resins). An aspect of this invention relates to formable, drapable graphite fabrics, including fabrics impregnated with hot melt or thermosettable or thermoplastic resins and the resulting formed surfaces or structures which they provide.

It has been known since the 1930's that woven fabrics can be used to build structures or shapes with good structural integrity. Fabrics suitable for this purpose are sometimes called "structural fabrics". Fabrics have the advantage of being more drapable and formable than other sheet-like structural materials such as sheet metal, and may even be more drapable or formable than polymeric sheets or films.

The development of both hot melt and thermosettable organic synthetic resins has dovetailed with the development of structural fabrics. Fabric plies or webs can be impregnated with suitable resins and still be formable and drapable, either at room temperature or at moderately elevated temperatures. Once the resin has been cured to a thermoset polymer or the hot melt has been fully solidified by cooling, the impregnated structural fabric can take on the high strength structural integrity of a piece of formed or shaped structural material. Additional strength or thickness can be obtained by using two or more plies of impregnated fabric.

In recent years, a great deal of research effort has been invested in the development of filaments and yarns which will produce structural fabrics of greater strength. Such filaments and yarns have been successfully produced from organic and inorganic polymers and various forms of carbon (such as graphite). Graphite fabrics or fibrous webs or sheet materials of various types are now commercially available, as are fibrous graphite composites or laminates. For "structural fabric" applications, fibrous graphite pregregs are of considerable interest.

The distinguishing characteristics of structural products made from fibrous graphite materials include high strength, light weight, high resistance to fatigue or failure, and corrosion resistance. These graphite materials are especially well suited to applications in space and aircraft hardware (including hardware with aerodynamically suitable surfaces, e.g. lifting surfaces, control surfaces, fuselages, etc.) where their high strength/weight ratios and long-term durability are essential. Commercial airplane manufacturers anticipate extensive use of such high strength materials in the future to reduce weight and conserve fuel.

For special purposes, it is known to form composite laminates by, for example, laminating two or more plies of graphite fabric (woven or unidirectional) together or by combining the graphite fabrics with decorative laminates so as to form strong, lightweight decorative panels for use as bulkheads in commercial passenger planes.

It is also known to form so-called hybrid fabrics from graphite fibers and other high strength organic or inorganic fibers. For example, graphite yarns, fiber bundles, and tows can be woven together with fibrous aromatic polyamides, silicates, and the like to obtain such hybrids. In woven materials, tracer yarns may be incorporated in the fabric to insure proper warp and fill fiber orientation during fabrication.

Situations can occur in which structural materials build up electrical charges or become subject to electromagnetic interference. For example, structural elements of aircraft can build up electrical charges when the aircraft is flying through an electrical storm or is struck by lightning. It can be desirable in these situations for the structural material to have low resistivity (i.e. high electrical conductivity). Valko, U.S. Pat. No. 3,288,175 teaches that static electricity generated on textile materials having high resistivity (i.e. low conductivity) can be removed by a continuous system of a conductive metallic fibers. The metallic fibers prevent static cling of apparel to the body and sparks caused by static electricity in a low relative humidity environment.

SUMMARY OF THE INVENTION

Although graphite is an electrically conductive material, it has been discovered that the resistivity of graphite is too large to avoid electrical problems such as charge build-up on aircraft structural elements. The excessively high resistivity of graphite is particularly likely to be a problem with plied graphite materials impregnated with resinous materials, particularly thermosetting resins. It has also been found that sufficient electrical conductivity to solve or substantially reduce these problems can be introduced into the fibrous graphite material (e.g. a cured graphite prepreg) by means of a surprisingly small number of strands or filaments (e.g. monofilaments, wires, fibers, fiber bundles, yarns, etc.) of a material having a lower resistivity than graphite. For example, the desired improvement in electrical conductivity (reduction in resistivity) can be introduced into a drapable and formable woven graphite fabric in which a plurality of the high conductivity filaments or strands are woven into the fabric along with the warp and/or fill graphite fibers. In one preferred embodiment of the invention, one metallic filament or strand is combined with a tow, fiber bundle, or yarn of graphite, and the resulting combination is included in either the fill or the warp or both the fill and the warp. Surprisingly, it has been found that not every yarn, fiber bundle, or tow need contain a metallic filament; there can be, for example, as few as one of these metallic filaments for each 165 tows, fiber bundles, or multifilament yarns of graphite in the warp or fill. This is also dependent upon the size or diameter of the fiber bundle or yarn being constructed into fabric. Stated another way, the spacing between metallic (or other highly conductive) strands or filaments, etc. can range from about 1 to 10 mm. In another preferred embodiment, the metallic strands or filaments are included in both the warp and fill at approximately the same spacing. Twisting or wrapping the metallic of filaments or strands with graphite filaments is preferred to provide the best quality of fabric; however, it has been found that sufficient electrical conductivity can be achieved when the highly conductive filament or strand is intermingled with or parallel to a graphite tow, fiber bundle, yarn, or other multifilament continuous graphite element in the woven graphite fabric.

BRIEF DESCRIPTION OF THE DRAWING

The Drawing is a fragmentary plan view of a woven graphite material having metallic strands or filaments woven into both the warp and fill of the fabric.

DETAILED DESCRIPTION

Referring first to the Drawing, woven graphite material (in this case a web-like fabric) designated by 10 comprises warp fiber bundles 11 and fill fiber bundles 12. These fiber bundles are sometimes referred to as "yarns". Most typically, they are multifilament structures in which the individual graphite filaments are extremely fine (e.g. in the microfiber range) and oriented generally parallel to each other and in generally the same plane. Typical microfibers range in diameter from less than a micrometer up to about five micrometers. Coarser graphite monofilaments are also known. Relatively large multifilament structures or fiber bundles are sometimes called "tows". In the embodiment shown in the Drawing, the total fabric structure 10 is shown enlarged by a factor of approximately eight. The fabric 10 can be stored in convoluted roll form of various widths—in the fragmentary view of the Drawing, this width would be approximately one meter, but widths ranging from about 0.01 to 2 meters are available. The number of graphite filaments in a multifilament bundle or tow or yarn is ordinarily very large, e.g. well over 100, more typically above 1,000, and in some cases up to 200,000. The filaments of the multifilament warp and fill 11 and 12, respectively, are generally continuous as opposed to "staple" or discontinuous. In the embodiment shown in the Drawing, metallic monofilaments 13 and 14 are included in some of the multifilament bundles or tows to improve electrical conductivity and lower resistivity. The multifilament graphite element 11 or 12 is shown in the drawing with an electrically conductive filament 13 or 14 wrapped or twisted around the element and with a filament that is such a fine wire that the multifilament graphite element is not twisted or bent during or after wrapping. Sufficient numbers of the multifilament elements having the conductive filaments are woven into the graphite fabric to prevent charge buildup caused by electrical storm or lighting. The electrically conductive filament 13 or 14 is shown with a diameter substantially less than the largest cross-section dimension of the multifilament graphite element 11 or 12 and is shown on both warp and fill elements that are made by wrapping or twisting the conductive filament around the element. The fabric 10 is shown in the drawing with electrically conductive filaments twisted around less than all the elements and with an overlapping weave made usign a mechanical loom by weaving, intertwining or forming a network of the multifilament graphite fiber elements. This typical structure contains both warp metallic filaments 13 and fill metallic filaments 14. Approximately every fourth fill 12 contains a metallic monofilament 14, and approximately every sixth warp 11 contains a metallic monofilament 13. Various metallic warp-to-fill ratios can be used, and various metallic monofilament densities can be used, ranging from more than one metallic monofilament per tow or yarn or bundle up to about one per ten or twenty, depending upon the size of the tows or yarns or bundles and the resulting spacing of the warp and fill metallic filaments 13 and 14. (A one-per-one metallic monofilament density is shown in the Drawing, and this density is typical.) For example, the spacing of the monofilaments 13 and 14 can be such that a pattern of squares or rectangles of monofilaments is formed, each rectangle having sides ranging in length or width from about a millimeter to more than a centimeter.

A wide variety of warp-to-fill ratios is also available with respect to the graphite fibers. Mechanical looms capable of positioning each graphite tow or fiber bundle in a precise manner in the total fabric pattern are in commercial use in the United States. Typical values for the tensile strength of the warp or fill can range from 10,000 psi to 200,000 psi or more (about $7 \times 10^6$ to $1.4 \times 10^8$ kg/m$^2$). The high stiffness of graphite fiber is one of its more characteristic properties. The tensile modulus of the warp or fill can range from 1,000,000 psi ($7 \times 10^8$ kg/m$^2$) on up, but more typically is above 5,000,000 psi ($3.5 \times 10^9$ kg/m$^2$) and values as high as 100,000,000 psi ($7 \times 10^{10}$ kg/m$^2$) can be obtained. The metallic filaments 13 and 14 have typically considerably less stiffness and tensile strength.

Information on the properties of impregnated woven graphite fabric is available in "Advanced Composite Materials", published by the Fiberite Corporation, Winona, Minn. Graphite fabrics of the type disclosed in this publication are available in commercial quantities from Fiberite Corporation and other manufacturers. The most effective means for introducing the filaments of high electrical conductivity is during the weaving of the graphite fabric, post-addition of metallic filaments and the like being inconvenient and generally undesirable.

The graphite fibers from which woven graphite plies are made are also commercially available and are produced by various techniques including carbonization of organic fibers. For example, the graphite fibers sold under trademarks such as "THORNEL" and "HITCO HMG-50" are both reported to be derived from synthetic fiber precursors. Thronel multi-filament graphite fibers having 1,000 to 6,000 fibers per element commonly have an inherent resistivity ranging from 460 to 1800 microohm-centimeters. These fibers can vary with respect to their wettability by liquid resins or resin/solvent systems. Surface treatments can be used to increase wettability.

Low Resistivity Strands or Filaments

The electrical conductivity characteristics of graphite are unique. Compared to semiconductors such as silicon or germanium, graphite is highly conductive—the semiconductors have almost two orders of magnitude more resistivity than graphite. However, it has been found that graphite (at least in the form of cured graphite prepregs) is not sufficiently conductive to prevent certain types of electrostatic charge buildup, electromagnetic interference, and the like.

Virtually all metals and metalloids have only a fraction of the resistivity of graphite. Even the least conductive of the metals and metalloids have resistivity values at room temperature of less than 200 microohm-centimeters, more typically less than 150 microohm-centimeters. At room temperature and elevated temperatures, the metalloids (e.g. arsenic, antimony, and bismuth) and the poorer conductors among the metals have resistivities ranging from 10 to 100 microohm-cm. The best of the metals range from about 1 to about 10 microohm-cm. Very few nonmetals are capable of such low resistivities, perhaps the only exception being selenium. Typical highly conductive metals include aluminum, chromium, cobalt, iron, copper, gold, magnesium, manganese, molybdenum, nickel, silver, titanium, tungsten, zinc, and their alloys, e.g. the ferrous metal alloys and aluminum alloys. Of these, the lower density metals (including alloys) are preferred for light weight.

It is also preferred that metals used as the highly conductive filaments in this invention have adequate tensile strength to be woven on mechanical looms suited for graphite fabric manufacture. Corrosion resistance is also a desirable property of the metal. Metals comprising aluminum (pure aluminum having an inherent resistivity of about 2.80 microohm-centimeters, and its alloys) meet these criteria reasonably well.

Typical structural fabrics made according to this invention comprise one or more drapable and formable plies, preferably impregnated with a formable impregnating agent. After curing or hardening or solidification of the impregnating agent, the fabric has structural capabilities. Not all the plies in the structural fabric need be woven. Nonwoven and unidirectional plies can be included. The high conductivity (low resistivity) strands or filaments are, however, typically contained in plies having directional orientation of fibers, particularly one or more of the woven plies.

The impregnating agent carried by the structural fabric can be either tacky or non-tacky at room temperature. Many preferred synthetic organic resin and hot melt impregnating agents have some degree of tack at normal ambient temperatures, which tack may be sufficient to cause storage or handling problems (e.g. blocking). These storage and handling problems can be minimized through the use of one or more release liners. In fact, a slightly tacky fabric adhered to a release liner can be a very convenient structural material and can be in convoluted tape or roll form.

It is also within the scope of this invention to produce unimpregnated, high conductivity fabrics which can be later converted to prepregs.

In any of these structural fabrics, both impregnated and non-impregnated, the warp and fill orientation or the unidirectional strand orientation can vary from ply to ply in laminates or multi-ply fabrics. These orientations can differ by, for example, 90° or 45° in a manner well known in the art. With respect to the length dimension of the composite, the warps or unidirectional alignments of typical alternating layers are oriented 0°/90° and +45°/−45°.

Hot melt, thermoplastic, and thermosettable impregnating agents are known in the art. When these agents are solids or high viscosity liquids, they can be impregnated into the fabric more easily (particularly when the impregnating conditions involve normal ambient temperatures) as solvent-based solutions. Typical solvents include lower (i.e. $C_1$–$C_6$) aliphatics, particularly oxo- and oxy-aliphatics, cyclic as well as alicyclic hydrocarbons, halogenated hydrocarbons, and the like. In the case of hot melts, hot melt impregnation techniques can be used. The use of solvent-based solutions is particularly desirable for lowering the viscosity of chain-extendible and/or crosslinkable resins or prepolymers or monomers and for solvent-based solutions of high strength, heat resistant thermoplastic or linear impregnating agents such as the polysulfones which, though resistant to mineral acids, alkalis, salt solutions, detergents, oils, and alcohols can be dissolved in polar organic solvents such as ketones, halogenated hydrocarbons, and aromatic hydrocarbons.

Prepregs made according to this invention can be used more or less immediately or placed in storage for future use. The impregnating agent can be selected to provide a shelf life of days, weeks, or months, during which time the cure (if any) of the impregnating agent will advance too slowly at normal ambient temperatures to interfere with further curing later on during molding steps and the like. A shelf life in excess of one week is readily achieved in practice, and shelf lives of up to six months or more are relatively common. For thermoplastic impregnating agents (e.g. polysulfones), hot melts, and the like, the shelf life can be considered to be substantially permanent.

Typical hot melt materials contain at least one thermoplastic polymer and can also contain tackifying resins and viscosity control agents (process oils, waxes, etc.).

In the context of typical uses of this invention, however, it is preferred that the impregnating agent be hardenable or settable or crosslinkable, so that the initially drapable and formable prepreg can be shaped or formed and then given permanent structural properties making it non-drapable and non-formable. Typically, the technique by which these permanent structural characteristics are imparted is a chemical curing reaction or hardening reaction which increases the crosslink density of the impregnating agent. Post-cure or post-bake reactions can also be used to further increase structural strength.

Accordingly, the preferred impregnating agents are crosslinkable prepolymers, sometimes called thermosettable resins. To insure good impregnation, solid resins or prepolymers can be dissolved in suitable solvents at solids levels ranging from 5 to 95% by weight, more typically above 50% by weight. Most of the common volatile liquid hydrocarbon, substituted (e.g. halogenated) hydrocarbon, and oxo- or oxy-aliphatic solvents can be used, alone or in cosolvent systems including inorganic solvents such as water. Graphite fibers are, of course, solvent resistant, and the only requirement for the solvent system in the case of such fibers is that it be reasonably volatile (e.g. at temperatures below 150° C. at normal ambient pressure) and able to adequately dissolve a significant percentage of resin or prepolymer.

Typical thermosettable resins or prepolymers include epoxies, polyimides, curable (e.g. unsaturation-containing) polyesters, phenolics (A-staged or B-staged), melamines, and other linear or branched-chain materials which can be interreacted or reacted with a co-curative to substantially increase the crosslink density, thereby providing a thermoset material which is resistant to common solvents and will generally hold its shape or structural integrity under heat stress, at least up to or approaching the point of thermal degradation. (Hot melt and other thermoplastic materials, on the other hand, have a softening point which is well below the temperature at which thermal degradation occurs.)

Fibrous graphite prepregs impregnated with phenolics (e.g. phenol-aldehydes), polyimides, and epoxies have been given a considerable amount of attention in the scientific literature. Of these known thermosettable systems, the epoxy resins are preferred. Aliphatic, cycloaliphatic, and aromatic polyepoxides are commercially available, the least expensive of these being the so-called "aliphatic" epoxides (which may contain aromatic rings, but not directly linked to the epoxide or oxirane rings). The Polyol-epichlorohydrin epoxides are the most readily available of the "aliphatics". These are most typically sold as liquid or solid diglycidyl ethers of Bisphenol A or other polyhydric phenols.

The epoxy equivalent weight (EEW) of the preferred polyglycidyl ethers of polyhydric phenols can vary, not only with respect to the molecular weight of the polyhydric phenol, but also with respect to the number of repeating units in the uncured epoxy "resin" or prepolymer chain. In addition, the functionality of the prepolymer can vary, diglycidyl being preferred, but other polyglycidyl ethers of higher functionality can be used, alone or in combination with monoglycidyl ethers. The use of monoglycidyl ethers shifts the statistical average functionality more toward 1.0 and tends to reduce the viscosity (or softening point, as the case may be) of the uncured resin. The viscosity of an uncured liquid epoxide or the softening point of a solid epoxide resin or prepolymer can also be raised or lowered with other types of epoxy compounds such as those unsaturated compounds which can be epoxidized, e.g. glyceryl esters of unsaturated carboxylic acids.

A typical preferred diglycidyl ether of a dihydric phenol has the structure:

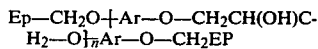

wherein
  Ep represents an oxirane or epoxide ring,
  Ar represents an aromatic nucleus, and
  n indicates the number of repeating units in the prepolymer chain.

When n is 0 the epoxy equivalent weight (EEW) is typically within the range of about 150 to about 250. The number of repeating units in this prepolymer chain (indicated by the index number n) can be as high as 10 or 20, in which case the EEW can be as high as 2,000 to 5,000. The higher EEW epoxy resins or prepolymers are typically solids but can be readily dissolved in oxo- or oxy-aliphatic solvents (particularly the lower aliphatics such as the lower ketones). In addition, these solid prepolymers have relatively low softening points and melting points and can be liquefied with heat. The use of high purity prepolymers (wherein n does not represent an average value but rather a small whole number typically within the range of 1-10 or 1-20) is neither necessary nor desirable. Mixtures of curable epoxy resins or prepolymers having varying EEW's,—varying aromatic nuclei, etc. can be used advantageously, particularly from a physical properties standpoint. For example, it is known that the substitution of methylol (—CH₂OH) substituents on the aromatic nuclei of the polyhydric phenol can speed up the rate of crosslinking or curing or hardening. Other known substituents can slow down the curing rate.

Solid diglycidyl ethers of Bisphenol A are commercially available, e.g. under the trademark "EPON" (Shell Chemical Company), those "EPON" resins having a suffix number above 1000 being typically the solid, high EEW resins.

Although the diglycidyl ethers of Bisphenol A and other aliphatic epoxides are the most readily available epoxy prepolymers, they are not necessarily superior in terms of high temperature properties. Cycloaliphatic and aromatic epoxy prepolymers or curable resins can have superior high temperature properties. Accordingly, it can be advantageous to blend aliphatic epoxides with other types such as the cycloaliphatics. Still another step which can be taken to modify the properties of these readily available epoxy prepolymers is to prereact them with a stoichiometrically deficient amount of active hydrogen-containing materials, so that an epoxy-terminated adduct is obtained. Adducts of this general type (e.g. the epoxy-novolacs) are commercially available. Epoxy-polyesters are also available.

Most thermosettable resins or prepolymers require the presence of a hardener or co-curative or curing agent to provide sufficient crosslink density for thermoset character. In addition, some curable prepolymer/curing agent systems require a catalyst to bring the rate of cure within practical limits, even at elevated temperatures. Typical catalysts are Lewis acids and compounds having an unbonded electron pair which can attack the epoxy or oxirane ring, resulting in the formation of a hydroxyl group which is itself an active hydrogen-containing substituent having unbonded electron pairs. The preferred practice of this invention is to blend the prepolymer with a co-curative (curing agent or hardener) which contains active hydrogen. ("Active hydrogen" is defined herein in accordance with the Zerewitinoff test.) Most of these active hydrogen-containing curing agents (wherein the active hydrogen-containing group is an amine, amide, carboxylic acid, carboxylic acid anhydride, hydroxyl, or mixtures of these, including mixed functional group compounds) react very slowly with epoxide rings at normal ambient temperatures. Accordingly, the blended epoxy/curing agent system can be considered to be substantially latent at room temperature, particularly in the absence of solvent. Restoration of solvent or moderate heating or the addition of catalyst can initiate the attack on the epoxide ring, resulting in molecular chain growth and/or crosslinking and hence a sharp increase in molecular weight. Catalysts used in the art for post-addition are of the Lewis acid type (e.g. the boron trihalides), which tend to initiate a cure even at room temperature and consequently are ordinarily not suited for pre-blended, latent-curable systems.

A typical co-curative or curing agent is dicyandiamide, which can be considered to be a mixed functional group (amine/cyanimide/imine) compound having a very low equivalent weight. A mixture of a solid epoxide prepolymer and dicyandiamide is substantially latent at normal ambient temperatures but reactive at elevated temperatures or in the presence of oxo- or oxyaliphatic solvents compatible with both the epoxide and the curing agent.

If desired, the latent-curable impregnating agent can be partially cured shortly after impregnation, so that the resulting prepreg will be dry or solventless, drapable, and formable, but still having sufficient latent curable properties to be brought to a much higher molecular weight and/or crosslink density. This technique can be used with many different types of resin systems and was first used with those of the phenolic type (e.g. phenol-aldehyde) to advance an A stage resin to the B stage for storage and later complete conversion to the C stage.

When heat alone is used to cure the impregnating agent in a prepreg, elevated temperatures below the decomposition temperature of the impregnating agent should be used. It is also desirable to avoid temperatures so high as to create unmanageable stresses imposed by differences in thermal expansion coefficients of different materials in the prepreg. Thus, typical heat-activated curing temperatures will be below about 250° C. The heat can be applied using heated molding surfaces or an oven in which the ambient temperature is in the desired range or higher. Ambient temperatures in the curing zone can be well above the desired temperature if the residence time in this heated zone is sufficiently short. Some substantially latent impregnating agents will cure with heat alone at relatively modest temperatures, e.g. 80° C. and higher. When solvent activation is used, curing temperatures can be much lower, even as low as 10° or 15° C., though temperatures at or above room temperature (20°–25° C.) would normally be preferred.

Prepregs of this invention are very light in weight, typically 120 to 140 grams per square meter (g/m$^2$). Weights as low as about 60 g/m$^2$ can be achieved in a production scale, as can weights as high as about 400 or 500 g/m$^2$, a more typical range being 65–370 g/m$^2$. The extremely high strength per unit weight of these composites is one of the factors which makes them extremely useful, even as compared to less complicated and less expensive structural materials which lack some of these strength properties.

The resin-impregnated woven graphite fabric (the prepreg) produced in accordance with the present invention is particularly useful in the production of high-performance structures for the aerospace industry. For example, the fuselage, vertical stabilizer, horizontal stabilizer, wings, and similar structural components of aircraft can comprise, at least at the surface, a cured prepreg of this invention.

For aerospace applications of this invention, control of the total weight of the composite is of considerable importance. Good quality control over the raw materials (e.g. the materials used to make plies) is one step toward weight control assurance. Another step is to keep close control (e.g. within a percent or two) over the content of the resin or other impregnating agent. For prepregs, a typical range of impregnating agent content is 20–50% by weight, more typically 25–40%.

What is claimed is:

1. A method for preparing a woven, drapable, electrically conductive graphite fabric having warp elements and fill elements which comprises the steps of:
    (a) Forming an electrically conductive weavable multifilament graphite element by wrapping around a parent multifilament graphite element, having from about 1,000 to about 200,000 graphite fibers, at least one electrically conductive filament having a diameter substantially less than the largest cross-section dimension of the multifilament graphite element, the electrically conductive filament thereby being combined with the graphite element such that the resultant composite graphite element member retains the high stiffness of the parent multifilament graphite element; and
    (b) weaving the electrically conductive weavable multifilament graphite element with multifilament graphite elements which have not been wrapped with a conductive filament such that every electrically conductive weavable multifilament graphite element is immediately adjacent to a parallel, relatively non-conductive multifilament graphite element.

2. The method of claim 1 wherein the diameter of the electrically conductive filament is such that the multifilament graphite element is not twisted and is not bent during the wrapping of the electrically conductive filament around the multifilament graphite element.

3. The method of claim 1 wherein the diameter of the electrically conductive filament is such that the multifilament graphite element is substantially untwisted and unbent after wrapping the electrically conductive filament around the multifilament graphite element.

4. The method of claim 3 wherein the electrically conductive filament is a metallic filament.

5. The method of claim 4 wherein the metallic filament is an aluminum filament.

6. The product of the method of claim 1.

7. A method to weave a drapable and formable graphite fabric which comprises the steps of:
    (a) forming a warp from multifilament graphite elements and forming a fill from multifilament graphite elements wherein there are wrapped around less than all of the multifilament graphite elements an effective number of electrically conductive filaments, having an electrical resistivity less than that of graphite, sufficient to prevent charge build-up, caused by lightning or electrical storm, on the graphite fabric; and
    (b) weaving the multifilament graphite elements such that each electrically conductive multifilament graphite element is adjacent to parallel, relatively non-conductive multifilament graphite elements, the resultant multifilament graphite elements being weavable into a drapable and formable graphite fabric by conventional weaving means.

8. The method of claim 7 wherein the fabric is about 0.01 to 2 meters in the fill dimension and has at least one conductive fiber for each 1 to 10 millimeters of either the warp or the fill dimension, or both the warp and the fill dimension.

9. The method of claim 7 wherein the diameter of the electrically conductive fiber is substantially smaller than the largest cross-section dimension of either the warp or the fill element.

10. The method of claim 7 wherein the warp or the fill multifilament graphite element contains 1,000 to 200,000 graphite fibers.

11. The method of claim 7 wherein the conductive fiber comprises a metallic fiber.

12. The method of claim 7 wherein the metallic fiber is an aluminum fiber.

* * * * *